United States Patent [19]

Topich

[11] Patent Number: 4,485,433
[45] Date of Patent: Nov. 27, 1984

[54] INTEGRATED CIRCUIT DUAL POLARITY HIGH VOLTAGE MULTIPLIER FOR EXTENDED OPERATING TEMPERATURE RANGE

[75] Inventor: James A. Topich, Centerville, Ohio

[73] Assignee: NCR Corporation, Dayton, Ohio

[21] Appl. No.: 452,239

[22] Filed: Dec. 22, 1982

[51] Int. Cl.$^3$ .............................................. H02M 3/18
[52] U.S. Cl. ........................................ 363/60; 363/65; 307/110
[58] Field of Search ....................... 363/59, 60, 61, 65; 307/110

*Primary Examiner*—William M. Shoop
*Assistant Examiner*—Anita M. Ault
*Attorney, Agent, or Firm*—J. T. Cavender; Casimer K. Salys; T. Rao Coca

[57] ABSTRACT

Disclosed is an on-chip, dual polarity high voltage multiplier circuit consisting of a main high positive voltage multiplier and high negative voltage multiplier and an auxiliary high negative voltage multiplier coupled to the main multipliers to prevent turning on of parasitic transistors associated with the MOS diodes of the main multipliers and thereby extend the operating temperature range to 150° C. and improve the fall time of the dual polarity multiplier. The auxiliary multiplier may be located in a common p-well with the main positive and negative multipliers or with the main negative multiplier and its output voltage is connected to this common well.

10 Claims, 7 Drawing Figures

INTEGRATED CIRCUIT DUAL POLARITY HIGH VOLTAGE MULTIPLIER FOR EXTENDED OPERATING TEMPERATURE RANGE

BACKGROUND OF THE INVENTION

This invention relates to an on-chip, dual polarity, high voltage multiplier and, more particularly, to a voltage multiplier having an extended operating temperature, as high as 150° C.

As used throughout, the following two definitions apply:

"Rise time" is the time taken by the positive voltage multiplier to increase its output voltage from approximately the 10% level to the 90% level of the final voltage.

"Fall time" is the time taken by the negative voltage multiplier to decrease its output voltage from approximately the 10% level to the 90% level of the final voltage.

To be competitive in the marketplace, a non-volatile memory device is now required to be a "5 volt only" device. This means that the memory device, for example a non-volatile random access memory (NVRAM), which typically requires multiple external power supplies (providing +5 volt, +22 volt and −22 volt voltages for read, write and erase operations, respectively) should have the capability to generate the high write and erase voltages, on chip, by utilizing a single 5 volt external power supply. One method of on-chip high-voltage generation is by means of the voltage multiplier technique. One such prior art voltage multiplier is shown in FIGS. 1A and 1B which represent circuits for generating a low negative voltage and a high positive voltage, respectively.

Referring to FIG. 1A, $V_g$ represents the ground connection and $V_{out}$ is the voltage output of the negative multiplier. $V_{out} << V_g$. $C_1$, $C_2$ - - - $C_n$ are coupling capacitors and $Q_1$, $Q_2$ - - - $Q_m$ are rectifying elements (or diodes). In this prior art voltage multiplier arrangement, the capacitors were permanent capacitors (i.e. their operation is not dependent on the polarity of the voltage applied across their plates) and the rectifying elements were diode-connected enhancement mode metal-oxide-semiconductor (MOS) transistors.

Referring to FIG. 1B, $V_{cc}$ here represents the input power supply voltage, typically 5 volts and $V'_{out}$ is the voltage output of the positive voltage multiplier. $V'_{out} >> V_{cc}$. As in FIG. 1A, $C'_1$, $C'_2$ - - - $C'_n$ and $Q'_1$, $Q'_2$ - - - $Q'_m$ represent coupling capacitors and diodes, respectively.

$\phi_1$ and $\phi_2$ shown in FIG. 1A and $\phi'_1$ and $\phi'_2$ shown in FIG. 1B designate two clock pulses, of the type shown in FIG. 2, having a fixed amplitude and in antiphase with each other. These pulses are applied to the successive nodes of the diode-chain via the coupling capacitors. The amplitude of these clock pulses is typically about 5 volts.

The output nodes $V_{out}$ and $V'_{out}$ of the negative and positive voltage multipliers shown in FIGS. 1A and 1B are connected together to generate high positive and low negative voltages at the same (output) node. This ability is essential for an on-chip voltage multiplier since devices on an integrated circuit chip, such as NVRAMs, invariably require that the same node of the voltage multiplier go both positive and negative for purposes of programming the device.

In actual construction of the on-chip dual polarity voltage multiplier, it is necessary that the MOS diode elements $Q_1$, $Q_2$ . . . $Q_m$ of the negative multiplier be located in regions of the substrate isolated from the remainder of the chip. This is necessary because the negative voltage multiplier pulls the isolated region negative with its output voltage. If isolation was not used, turning on of the negative voltage multiplier would interfere with the functioning of the peripheral circuits. The isolated region may be either a diffused well or an isolated epitaxial region formed on the substrate. For example, if the diodes $Q_1$, $Q_2$ - - - $Q_m$ are n-channel MOS devices, the diffused well approach will utilize an n-type substrate in which p-wells are formed. The corresponding isolated epitaxial region approach, which is disclosed in the copending application Ser. No. 410,674, entitled "Method of Fabricating An I.C. Voltage Multiplier" by the present inventor and assigned to the assignee of the present invention, is shown in FIG. 3. This approach involves using an n-type substrate 10 (typically, single crystal silicon) having thereon a p-type epitaxial silicon layer (hereafter, p-epi layer) 11 flanked by deep N+ diffusions 12. The diffusions 12—12 isolate the p-type epitaxial layer 11 from the remainder of the integrated circuit.

Regardless of whether the diffused well or isolated epitaxial region approach is chosen, the dual polarity voltage multiplier suffers from (1) a slow response (i.e. long fall time) of the negative multiplier due to a large substrate to p-epi/p-well junction capacitance $C_{ss}$ and (2) rapid deterioration of the negative voltage multiplication scheme at elevated temperatures due to the turning on during the negative cycle of the clock pulses $\phi_1$ and $\phi_2$ of parasitic transistors associated with the MOS devices. To fully understand these problems, reference is made to FIG. 3 wherein is shown, in cross-sectional representation, the diode $Q_2$ (of FIG. 1A). The diode $Q_2$ shown in FIG. 3 is an n-channel MOS transistor and comprises a conductive polysilicon gate 13 and highly doped n+ drain and source regions 14 and 15, respectively. A relatively thin silicon dioxide (gate oxide) 16 insulates the polysilicon gate 13 from the underlying p-epi region 11. Transistor $Q_2$ further includes metal contacts 17, 18, and 19 making electrical contact, respectively, with drain 14, source 15 and gate 13. For consistency with FIG. 1A, gate 13 and drain 14 of transistor $Q_2$ shown in FIG. 3 are connected together and this common point is connected to the (source of) transistor $Q_3$ and one plate of coupling capacitor $C_2$ and the source 15 of $Q_2$ is connected to coupling capacitor $C_1$ and transistor $Q_1$.

In operation, a nominal 5 volt potential is always applied to the substrate 10. For the low negative voltage multiplication to take place the p-epi layer 11 to n-substrate 10 junction capacitance $C_{ss}$ needs to be charged. However, because the parasitic bipolar transistor formed by the n+ drain 14, the p-epi region 11 and the n-substrate 10 is turned on whenever the n+ region 14 is pulled more negative than the p-epi region 11, the effective capacitance of the p-epi to substrate 10 junction $C_{eff}$ will be increased by a factor equal to the current gain B of the parasitic transistor mentioned hereinabove. In other words, $C_{eff}$ is equal to $B \times C_{ss}$. The gain B is inversely proportional to the thickness of the p-epi layer 11 and typically is high, of the order of one hundred or more. As a result of this large effective capacitance, the p-epi to n-substrate capacitor will be charged rather slowly and thereby the fall time of the negative voltage multiplier will be undesirably increased.

The deterioration in the performance of the negative voltage multiplier with increasing temperature referred to hereinabove is due to the relative ease of turning on of the parasitic bipolar transistor 14-11-10 (FIG. 3) during the negative cycle of the waveforms $\phi_1$ and $\phi_2$ which drive the multiplier. As temperature increases, the built-in potential of the parasitic bipolar transistor pn junctions will decrease, making this parasitic transistor turn on more easily. Consequently, the parasitic transistor will compete with the MOS transistor $Q_2$ and will transfer off more and more voltage multiplier output current to the substrate 10 via the parasitic transistor rather than enabling the output current to be transferred to the successive stages of the negative voltage multiplier. As a result of this competition between the parasitic bipolar transistor and the MOS transistor, the negative voltage multiplication will deteriorate.

The positive voltage multiplier in the dual polarity voltage multiplier pair (shown in FIG. 1B) does not suffer from the above problems associated with the negative multiplier since the parasitic transistors associated with the MOS diodes that are utilized in the construction of the positive voltage multiplier are not turned on. This is because the p-epi region similar to 11 in this case is always at least 5 V more negative than any of the n+ regions similar to 14 (FIG. 3). Consequently, the waveforms $\phi_1$ and $\phi_2$ (which are $\pm 5$ V) can never bring the n+ region to a more negative potential than the p-epi region. Since the parasitic transistors are not turned on, there is no shunting of current from the positive multiplier output node to the substrate. Also, since there is no need for charging up the p-epi layer to substrate 10 capacitance, the rise time of the positive voltage multiplier is not affected.

One way of solving the above problems associated with the negative voltage multiplier is to connect the output of the negative multiplier $V_{out}$ (FIG. 1A) to the p-epi well region 11 and thereby reducing the current going to substrate 10 (FIG. 3). However, this is not practical, since the output node $V_{out}$ of the negative multiplier is connected to the output node $V'_{out}$ of the positive multiplier and this common node goes both positive and negative during the operation of the positive multiplier and negative multiplier respectively. As a result, whenever the positive output of this common node is applied to the p-epi well region 11, the pn junction (isolation diode) formed by the p-epi region 11 and the n-substrate 10 will be forward biased, thereby limiting the positive voltage to an isolation diode drop higher than the bias on the n-substrate 10. Consequently, the positive voltage multiplier operation will be severely inhibited.

SUMMARY OF THE INVENTION

It is an object of the present invention to provide an on-chip, dual polarity voltage multiplier capable of operating in the wide temperature range of ($-55$ to 150)°C.

It is another object of this invention to provide an on-chip, dual polarity voltage multiplier having an improved fall time.

These and other objects are accomplished by means of an auxiliary, on-chip, negative voltage multiplier which is located in the common p-well of the dual polarity voltage multiplier and whose low negative voltage output is connected to the common p-well. Alternately, the auxiliary voltage multiplier may be located in a separate p-well and its output is connected to the p-well in which the main negative voltage multiplier is located. The voltage output of the auxiliary multiplier is lower (i.e. more negative) than the negative voltage output of the dual polarity voltage multiplier to ensure that parasitic transistors associated with the negative voltage multiplier are not turned on during operation of the dual polarity multiplier. Since the parasitic transistors associated with the negative multiplier are not turned on, it is possible to enhance the dual polarity multiplier operating temperature range and significantly reduce its fall time.

BRIEF DESCRIPTION OF THE DRAWING

FIG. 1A represents a negative voltage multiplier and FIG. 1B represents a positive voltage multiplier.

DETAILED DESCRIPTION OF THE PREFERRED EMBODIMENT

Figure 4:
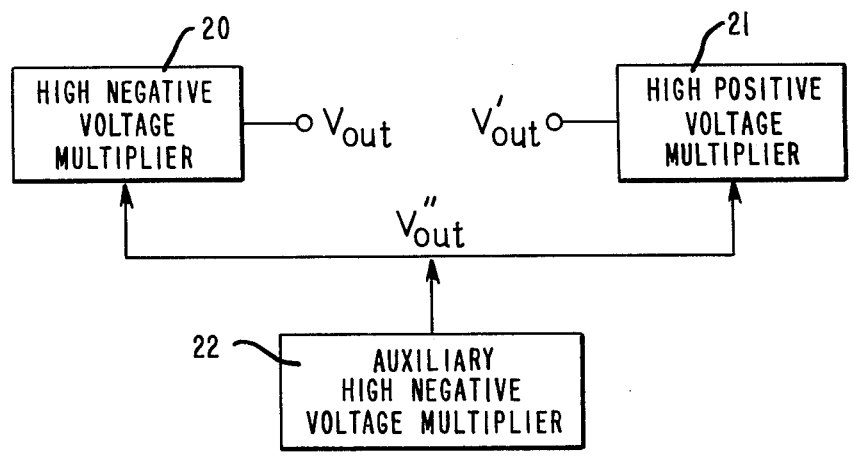
FIG. 4 is a block diagram illustrating the dual polarity voltage multiplier for extended operating temperatures in accordance with the principles of the present invention.

In one illustrated embodiment, shown in block diagram representation in FIG. 4, the on-chip, dual polarity high voltage multiplier for extended operating temperature range comprises a high negative voltage multiplier 20 having an output designated as $V_{out}$, a high positive voltage multiplier 21 having an output $V'_{out}$ and an auxiliary high negative voltage multiplier 22 having an output designated as $V''_{out}$. The outputs $V_{out}$ and $V'_{out}$ are connected together to generate the necessary high write and erase voltages at the same node. These voltages are typically about $\pm(20-25)$ volts.

Figures 1A, 1B, 2:
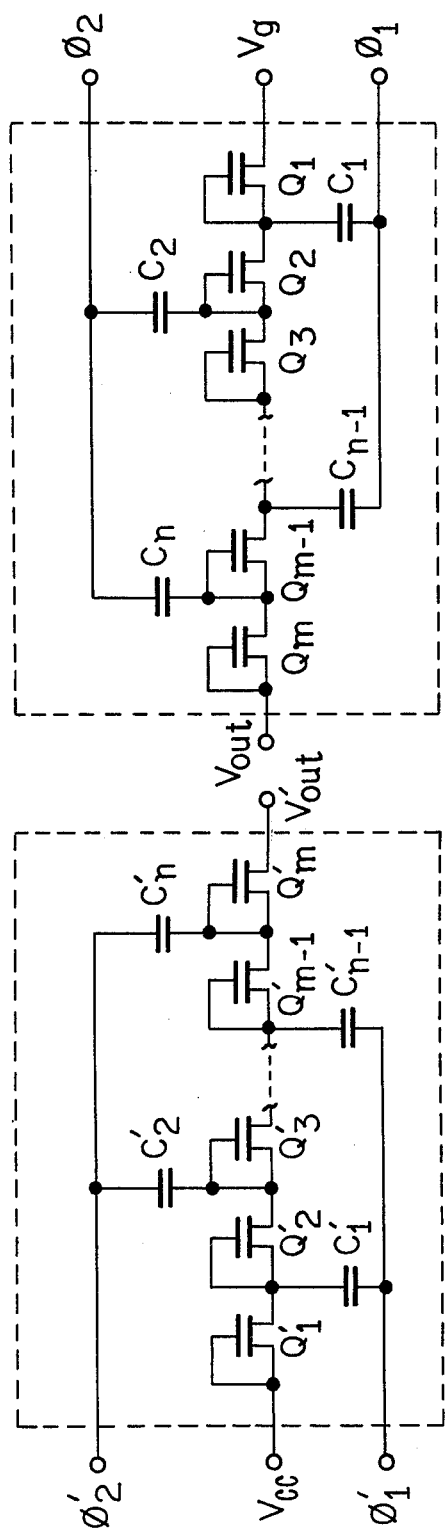
FIGS. 1A and 1B are schematic diagrams of prior art voltage multiplier circuits.
FIG. 2 is a schematic representation of the voltage waveforms (clock pulses) applied to the successive nodes of the voltage multiplier.

Multipliers 20 and 21 may be constructed by means of permanent coupling capacitors and n-channel MOS transistors (diodes) using the voltage multiplication scheme shown in FIGS. 1A and 1B, respectively. (The necessity for using permanent capacitors rather than depletion mode transistors arises from the need to generate at a common output node of multipliers 20 and 21 both positive and negative voltages. If depletion mode devices are used as coupling capacitors, then, many of the depletion devices in each multiplier scheme shown in FIGS. 1A and 1B will be turned off whenever the common output node goes to a polarity opposite to the output polarity of the individual multipliers 20 and 21, thus hampering the operation of these multipliers.) In the alternative, the coupling capacitors may be parallel plate capacitors using polysilicon as the plate material. The coupling capacitors $C_1, C_2 - - - C_n$ and $C'_1, C'_2 - - - C'_n$ and MOS transistors $Q_1, Q_2 - - - Q_m$ and $Q'_1, Q'_2 - - - Q'_m$ of multipliers 20 and 21, respectively, may be located in a common p-well (whether it be a p-well diffused into an n-type substrate or a p-epi layer formed on an n-type substrate and flanked on all sides by deep n+ diffusions) or in individual p-wells (one p-well per multiplier) depending on the layout of the remainder of the I.C. on the chip. The number of voltage multiplication stages necessary for multipliers 20 and 21 is dictated by the required write and erase voltages of the devices on the chip, the higher the required voltage, the more are the number of stages. The output current requirements of multipliers 20 and 21 are also dictated by the requirements of the I.C. on the chip. Typically, for NVRAMs the positive and negative currents required are approximately 100 microamps.

Referring to FIG. 4, the output $V''_{out}$ of the auxiliary multiplier 22 is connected to the p-well(s) in which the MOS transistors constituting the individual multipliers 20, 21 (and 22) are located to maintain the p-well(s) always (i.e. regardless of operating temperature) at a sufficiently low negative potential to prevent turning on of the parasitic bipolar transistors associated with the MOS transistors $Q_1$, $Q_2$ - - - $Q_m$ of the negative voltage multiplier 20 (and the auxiliary multiplier 22). Since the parasitic transistors associated with the transistors $Q_1$, $Q_2$ - - - $Q_m$ are not turned on even at high operating temperatures (of the order of 150° C.), the negative voltage multiplier output current transfer by these parasitic devices to the substrate, which is characteristic of prior art voltage multiplier circuits, is eliminated and an extended operating temperature capability for the dual polarity voltage multiplier is achieved.

The auxiliary negative voltage multiplier 22 may be constructed using the voltage multiplication scheme shown in FIG. 1A. For convenience, the capacitors and MOS transistors which constitute the auxiliary multiplier 22 are designated as $C''_1$, $C''_2$ - - - $C''_n$ and $Q''_1$, $Q''_2$ - - - $Q''_m$, respectively. In this construction, the coupling capacitors $C''_1$, $C''_2$ - - - $C''_n$ may be depletion mode transistors rather than permanent capacitors since the output node of the auxiliary multiplier 22 always remains at negative polarity and there is no possibility of the depletion mode devices being turned off and the auxiliary multiplier made non-functional. The transistors $Q''_1$, $Q''_2$ - - - $Q''_m$ may be n-channel MOS devices of the type used in the construction of multiplier 20. One such MOS transistor $Q''_m$, which corresponds to the final stage of the auxiliary multiplier 22, is shown in cross-sectional representation in FIG. 5.

Figure 3:
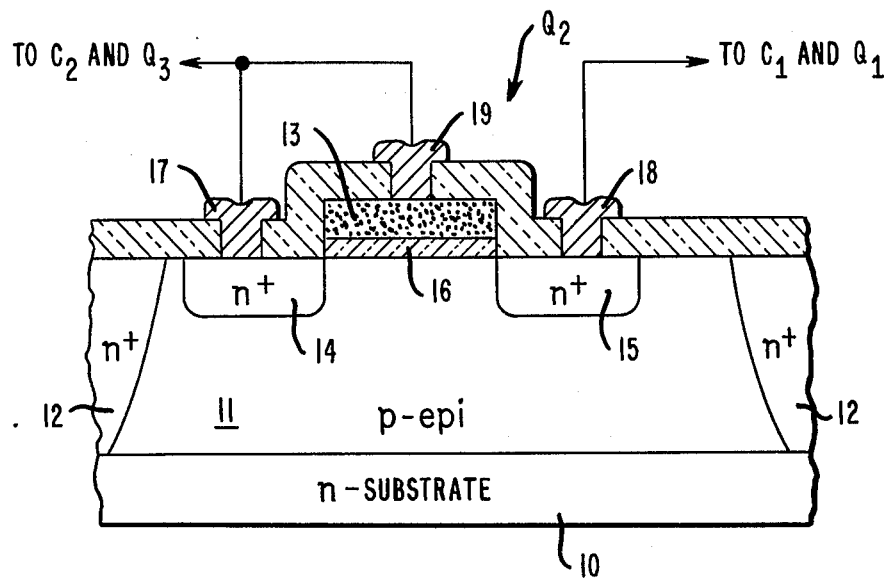
FIG. 3 is a partial sectional view of the transistor $Q_2$ shown in FIG. 1A.
Figure 5:
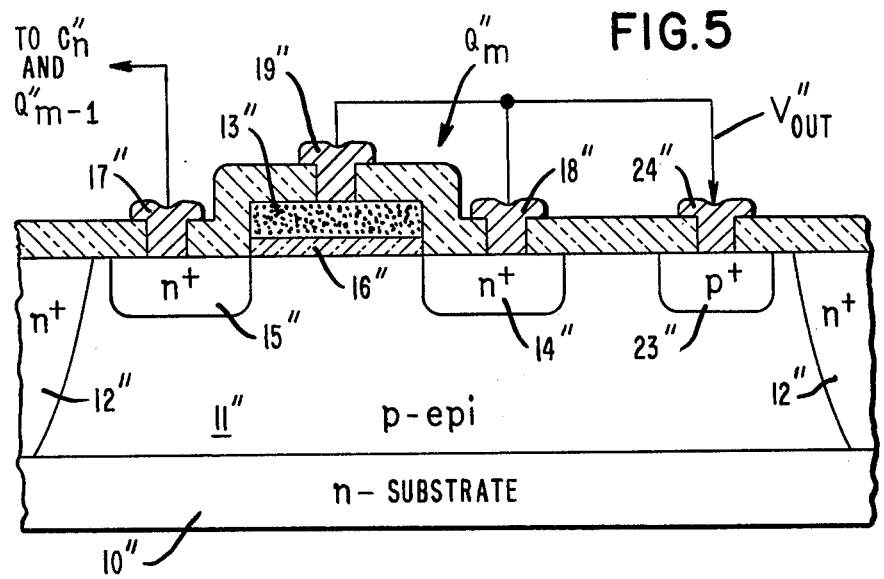
FIG. 5 is a partial sectional view of the auxiliary voltage multiplier output connection.

In FIG. 5, the various parts of the transistor $Q''_m$ structure designated by double primed numerals 10'' to 19'' correspond to like parts of transistor $Q_2$ structure shown in FIG. 3 and designated by numerals 10 to 19 with the exception that p-epi region 11'' may be a common well in which the various components of all the three multipliers 20, 21 and 22 or at least the components of multipliers 20 and 22 (FIG. 4) are located. As shown in FIG. 5, the final voltage output $V''_{out}$ of the auxiliary multiplier 22 which is generated at the drain 14'' is applied to the common p-well 11'' via the enhanced contact region 23'' which is formed to enhance the metal connection 24'' to the p-epi well 11''. A method of accomplishing this enhanced metal-to-p-contact is disclosed in the copending U.S. patent application Ser. No. 409,193 entitled "Expitaxial Contact Fabrication Process" by John E. Dickman, Raymond A. Turi and the present inventor, and assigned to the assignee of the present invention.

Since the positive voltage multiplier 21 (FIG. 4) does not suffer from the turning on of parasitic transistors associated with the MOS diodes utilized in its construction (since the p-epi region 11 in this case is always at a potential more negative than any of the n+ regions, see FIG. 3), there is no requirement for the output $V''_{out}$ of the auxiliary multiplier 22 to be applied to the p-epi region in which the MOS devices of multiplier 21 are located. Thus, if the MOS devices of multiplier 21 are located in a first p-epi region on the substrate and the MOS devices of multipliers 20 and 22 are located in a second and third p-epi regions (or a common p-epi region) on the substrate, then to extend the operating temperature of the dual voltage multiplier, the output $V''_{out}$ of multiplier 22 needs to be connected only to the second and third p-epi regions (or the common p-epi region).

In designing the auxiliary negative multiplier 22, the voltage output $V''_{out}$ should be at least (3–5) volts more negative than the maximum negative voltage generated on the chip (i.e. the output $V_{out}$) to ensure that the parasitic transistors associated with the negative voltage multiplier 20 are not turned on. Referring to FIG. 3, by maintaining the p-epi well 11 at a more negative potential than the n+ region 14, the bipolar transistor 14-11-10 is prevented from turning on. In order to generate the above-mentioned low voltage, it is necessary that the auxiliary multiplier 22 be regulated at a voltage more negative than the negative voltage multiplier 20.

The auxiliary multiplier 22 need not have a shorter fall time than the multiplier 20 since the sole function of multiplier 22 is to generate a more negative voltage than $V_{out}$ and continuously supply this voltage to the p-epi well region(s).

Referring to FIG. 4, although the voltage output $V''_{out}$ of the auxiliary multiplier 22 is required to be more negative than the output $V_{out}$ of multiplier 20, there is no such requirement with regard to the output current of the auxiliary multiplier 22. In fact, the auxiliary multiplier 22 need not generate a high current. The output current of multiplier 22 may be of a value which is sufficient to maintain the p-well(s) of multipliers 20 and 22 charged (i.e. maintain the p-epi to n-substrate capacitance charged) during operation of the dual polarity voltage multiplier shown in FIG. 4. In this connection, it is important to take into consideration the substrate current (i.e. the current that is shunted to the substrate 10'' (FIG. 5) on which the auxiliary multiplier is located due to the switching of the voltage waveforms $\phi_1$ and $\phi_2$ (FIG. 2) which are applied to drive the multiplier). The substrate current is a function of the current gain of the parasitic npn transistor formed between the n+ region 14, p-epi region 11'' and the substrate 10'' (FIG. 5). The substrate current will increase with the current gain of the parasitic transistor. If the current gain is too large, then all of the output current that the multiplier can generate will go to the substrate and the operation of the dual polarity voltage multiplier will be jeopardized since there will be no output current available at $V''_{out}$ (FIG. 4) for driving (i.e. charging) the p-well(s) of other multipliers. Because the current gain of parasitic transistors is inversely proportional to the p-epi region 11'' thickness, one way of decreasing the current gain (and therefore decreasing the substrate current and increasing the output current) is to use a thick, of the order of (15–18) microns thickness, p-epi layer 11''.

The auxiliary multiplier output current and substrate current are functions of temperature as well. At room temperature, the substrate current is typically about twice that of the output current. At a high temperature of about 150° C., the substrate current may be three times as large as the output current. The reason for the increase in substrate current at high temperatures is due to the parasitic npn transistors being easily turned on as temperature increases.

Since the auxiliary multiplier 22 should generate a more negative voltage output $V''_{out}$ than the output $V_{out}$ of negative multiplier 20 (FIG. 4) but need not provide a larger output current than that of multiplier 20 or have a smaller fall time than that of multiplier 20, the number of voltage multiplication stages needed to construct the multiplier 22 could be smaller than that of multiplier 20.

CHARACTERIZATION

The performance of a voltage multiplier circuit in accordance with the present invention was evaluated by fabricating, testing at various temperatures and evaluating two negative multiplier circuits, one having the auxiliary voltage multiplier and the second without the auxiliary multiplier. The main negative multiplier circuits and the auxiliary multiplier circuit each consisted of eighteen stages, but they were regulated at different voltages. The negative multipliers were regulated at a voltage of −20 volts and the auxiliary multiplier was regulated at a more negative voltage of −25 volts. The coupling capacitors used in this construction were parallel polysilicon plate capacitors and the rectifying elements were n-channel MOS transistors. The multipliers were fabricated using the process disclosed in the previously-mentioned U.S. application Ser. No. 410,674, by the present inventor. In the case of the negative multiplier having the auxiliary multiplier, each multiplier was located in a separate p-epi well and the output of the auxiliary multiplier was tied to both p-epi wells. The p-epi layer thickness was approximately 15 microns.

Figure 6:
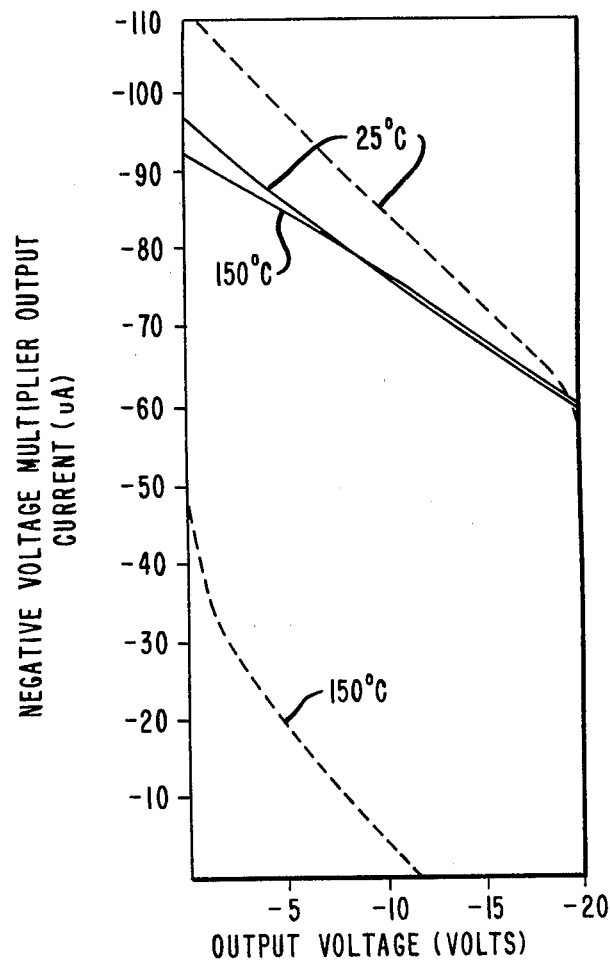
FIG. 6 is a graphical comparison of the output characteristics at different temperatures of a negative voltage multiplier constructed in accordance with the present invention and a conventional negative voltage multiplier.

The test results are illustrated in FIG. 6 showing the I-V characteristics of the negative multipliers with and without the use of the auxiliary multiplier at the room temperature of 25° C. and a high 150° C. temperature. The I-V characteristics of the multiplier paired with the auxiliary multiplier is shown by the continuous lines and those of the multiplier without the auxiliary multiplier are shown by the dashed lines. The voltage multiplier output current plotted on the vertical axis is negative in accordance with the convention that in a negative voltage multiplier circuit current flows into the multiplier output node.

It is quite apparent from FIG. 6 that the I-V characteristics of the negative voltage multiplier without the auxiliary multiplier degraded quite significantly at the high temperature as compared with its characteristics at room temperature. First, this voltage multiplier was able to generate an output current only in the low voltage range of 0 to −12 volts. Second, the output current of this multiplier was also low of approximately 0 to −50 microamps. Both of these results render this multiplier unsuitable at high temperatures for most, on-chip, voltage generation purposes.

In contrast with the poor results obtained with the single voltage multiplier, the negative multiplier paired with the auxiliary multiplier has excellent operational features. In this case, the I-V characteristics were essentially independent of temperatures in the range (25–150)°C. The circuit generated high negative output voltages of more than about −20 volts. The output current of this multiplier was sufficiently high, in the range of about (−60 to −95) microamps.

Thus, there has been described a dual polarity, high voltage multiplier having the capability of operating at an extended temperature range of up to 150° C. by means of an, on-chip, auxiliary negative voltage multiplier whose output is continuously applied to the common p-well of all the multipliers that constitute the dual polarity multiplier or to the individual p-wells of each negative multiplier. Since the output voltage of the auxiliary multiplier is more negative than that of the main negative multiplier, the p-wells are always maintained at a low enough potential to prevent turning on of parasitic bipolar transistors associated with the MOS devices used for the individual multiplier construction. In this manner, the substrate current which jeopardizes the dual polarity voltage multiplier operation is eliminated. Since the p-wells are maintained at a low negative potential at all temperatures of up to 150° C., extended operating temperature capability of the dual voltage multiplier is achieved. Also, since the p-well is always maintained at a low potential, the need for charging the p-epi-to-substrate capacitance is eliminated. Consequently, the fall time of the dual voltage multiplier is significantly improved.

While the invention has been described in connection with the use of an on-chip auxiliary negative voltage multiplier to extend the operating temperature range of an on-chip dual polarity high voltage multiplier, the invention, however, is not so limited. Another application of the auxiliary multiplier involves its use with a back bias generator to extend the operating temperature range of the back bias generator circuit. The back bias generator typically comprises a negative voltage multiplier, having a low negative voltage (−2 volts to −5 volts) output and constructed using coupling capacitors and MOS diodes connected in the voltage multiplication scheme shown in FIG. 1A. The back bias generator suffers from loss of current to the substrate, particularly at high temperatures, due to the turning on of parasitic bipolar transistors associated with the various (n-channel) MOS diodes located on a p-epi/p-well region of the (n-type) substrate. One way of solving this problem is to connect the output node of the back bias generator to its own p-well/p-epi region. However, to compensate for the loss of current to the substrate, the back bias generator will then have to generate a current which is significantly larger than the required output current. For example, if the required output current is about 100 microamps, the back bias generator will have to generate a current of as much as 200 microamps. In order to generate this large current the coupling capacitors constituting the back bias generator will have to be large (in area). However, these large capacitors will consume a large area of valuable chip real estate thereby decreasing device density on the chip.

By using an auxiliary negative voltage multiplier whose output is connected to the p-well/p-epi region in which the MOS diodes of back bias generator are located the above problems associated with the conventional back bias generator are solved. The auxiliary voltage multiplier output voltages and current for this application are sufficiently small of about (−5 to −8) volts and (1-10) microamps, respectively. These outputs maintain the p-epi/p-well region of the back bias generator sufficiently more negative than the $n^{30}$ regions associated with the MOS devices and prevent turning on of the parasitic bipolar devices associated therewith. Since the auxiliary voltage multiplier output current is small, the coupling capacitors constituting the auxiliary multiplier are small (in area). Thus, even though an additional, on-chip, (auxiliary) voltage multiplier is used with the back bias generator, a net savings in chip real estate is obtained.

Since, typically, the output voltage of the auxiliary multiplier for the back bias generation application need not be more than about −8 volts, the auxiliary multiplier in this case can be constructed with 2 or 3 voltage multiplication stages.

While the invention has been shown and described with respect to a preferred embodiment thereof, it will be understood by those skilled in the art that various changes in form and detail may be made therein without departing from the spirit and scope of the invention.

I claim:

1. A dual polarity voltage amplifier integrated circuit on a semiconductor substrate of a first conductivity type having an isolated region of an opposite conductivity type, said circuit comprising:
   a positive voltage multiplier consisting of a plurality of coupling capacitors and metal-oxide-semiconductor (MOS) diodes connected together for generating a positive output voltage, said MOS diodes being located in said isolated region;
   a negative voltage multiplier consisting of a plurality of coupling capacitors and MOS diodes for generating a negative output voltage, said negative multiplier MOS diodes being located in said isolated region; and
   an auxiliary voltage multiplier consisting of a plurality of coupling capacitors and MOS diodes for generating a negative output voltage more negative than said negative multiplier output, said auxiliary multiplier MOS diodes being located in said isolated region and said auxiliary multiplier output applied to said isolated region.

2. A dual polarity voltage multiplier integrated circuit on a semiconductor substrate of a first conductivity type having a plurality of isolated regions of a conductivity type opposite to said first conductivity type, said circuit comprising:
   a positive voltage multiplier having a plurality of coupling capacitors and metal-oxide-semiconductor (MOS) diodes connected together for generating a positive output voltage, said MOS diodes being located in a first isolated region;
   a negative voltage multiplier having a plurality of coupling capacitors and MOS diodes connected together for generating a negative output voltage, said negative multiplier MOS diodes being located in a second isolated region; and
   an auxiliary negative voltage multiplier having a plurality of coupling capacitors and MOS diodes connected together for generating a negative output voltage more negative than the output voltage of said negative multiplier, said auxiliary multiplier MOS diodes being located in a third isolated region and said auxiliary multiplier output voltage applied to said second and third isolated regions.

3. The circuit as in claim 2 wherein the coupling capacitors are parallel polysilicon plate capacitors.

4. The circuit as in claim 2 wherein the coupling capacitors constituting said positive voltage multiplier and negative voltage multiplier are parallel polysilicon plate capacitors and the coupling capacitors constituting the auxiliary multiplier are depletion-mode devices.

5. The circuit as in claim 2 wherein said substrate is n-type single crystal silicon and said first and second regions are p-type epitaxial silicon.

6. A voltage multiplier circuit on an n-type semiconductor substrate having a first and second p-type isolated regions thereon, said circuit comprising:
   a first voltage multiplier having a plurality of coupling capacitors and metal-oxide-semiconductor (MOS) diodes connected together for generating a negative voltage output, said first multiplier MOS diodes being located in said first p-type region; and
   a second voltage multiplier having a plurality of coupling capacitors and MOS diodes connected together for generating a negative voltage output more negative than said first multiplier output, said second multiplier MOS diodes being located in said second p-type region and said second multiplier output connected to said first and second p-type regions.

7. The circuit as in claim 6 further comprising a third voltage multiplier having a plurality of coupling capacitors and MOS diodes connected together for generating a positive voltage output, said third multiplier MOS devices being located in said first or second p-type region.

8. The circuit as in claim 7 wherein said substrate is single crystal silicon and said p-type regions are epitaxial silicon.

9. A dual polarity high voltage multiplier integrated circuit on an n-type semiconductor silicon substrate having an isolated p-type expitaxial silicon region thereon, said circuit comprising:
   a first voltage multiplier having a plurality of coupling capacitors and n-channel MOS diodes connected together for generating a high positive voltage output, said MOS diodes being located on said epitaxial region;
   a second voltage multiplier having a plurality of coupling capacitors and n-channel MOS diodes connected together for generating a low negative voltage output, said second multiplier MOS diodes being located in said epitaxial region; and
   a third voltage multiplier having a plurality of coupling capacitors and n-channel MOS diodes connected together for generating a negative voltage output which is more negative than said second multiplier voltage output, said third multiplier MOS diodes being located in said epitaxial region and said third multiplier output applied to said epitaxial region.

10. The circuit as in claim 9 wherein said coupling capacitors are parallel polysilicon plate capacitors located on said substrate.

* * * * *